United States Patent [19]

Tanielian et al.

[11] Patent Number: 5,051,738
[45] Date of Patent: Sep. 24, 1991

[54] IMAGING SYSTEM

[75] Inventors: Aram Tanielian, Rancho Palos Verdes; W. Edward Naugler, Jr., Seal Beach, both of Calif.

[73] Assignee: Revtek Inc., Torrance, Calif.

[21] Appl. No.: 315,486

[22] Filed: Feb. 27, 1989

[51] Int. Cl.⁵ .............................................. G09G 3/32
[52] U.S. Cl. .................................... 340/782; 340/762; 313/500; 357/13
[58] Field of Search ....................... 340/718, 782, 762; 313/499, 500; 357/20, 17, 13

[56] References Cited

U.S. PATENT DOCUMENTS

| | | | |
|---|---|---|---|
| 3,792,465 | 2/1974 | Collins et al. | 340/718 |
| 3,893,149 | 7/1975 | Grenon | 313/500 |
| 4,127,792 | 11/1978 | Nakata | 313/500 |
| 4,165,474 | 8/1979 | Myers | 357/17 |
| 4,225,380 | 9/1980 | Wickens | 313/449 |
| 4,523,189 | 6/1985 | Takahara et al. | 357/13 |
| 4,538,143 | 8/1985 | Ito | 340/718 |
| 4,845,405 | 7/1989 | Yamane et al. | 340/762 |

Primary Examiner—Jeffery A. Brier
Assistant Examiner—Xiao Min Wu
Attorney, Agent, or Firm—Ellsworth R. Roston; Charles H. Schwartz

[57] ABSTRACT

A plurality of semi-conductor diodes disposed in an array may be constructed to emit light when subjected to a particular voltage. This voltage reversely biases the semi-conductor diodes to break down the semi-conductor diodes and to provide for the emission of light upon breakdown. The breakdown occurs at the junction between a pair of electrodes in each semi-conductor diode. One of the electrodes may be an n electrode and the other electrode may be a p electrode. To break down the diode, a positive voltage (e.g. 3-5 volts) may be applied to the n electrode and a ground voltage may be applied to the p electrode. The diodes are so small that an array of 1024×1024 diodes can be disposed in a space approximately 0.4" square to act as pixels. The diodes may be scanned, as in a raster scan, preferably on a repetitive basis. During such scan, individual ones of the diodes receive the breakdown voltage in representation of a visual image to provide a visual display of the image in the pixels defined by the diodes. The emitted light for each pixel is visible at the junction between the p electrode and the n electrode in the diode representing such pixel. The n electrode may be shaped, as in a tear drop, to facilitate the production of the light at such junction, which may be at the pointed end of the tear drop. The light may be formed by the emission of photons when electrons are momentarily trapped in an oxide layer above the junction and then fall back to ground.

32 Claims, 2 Drawing Sheets

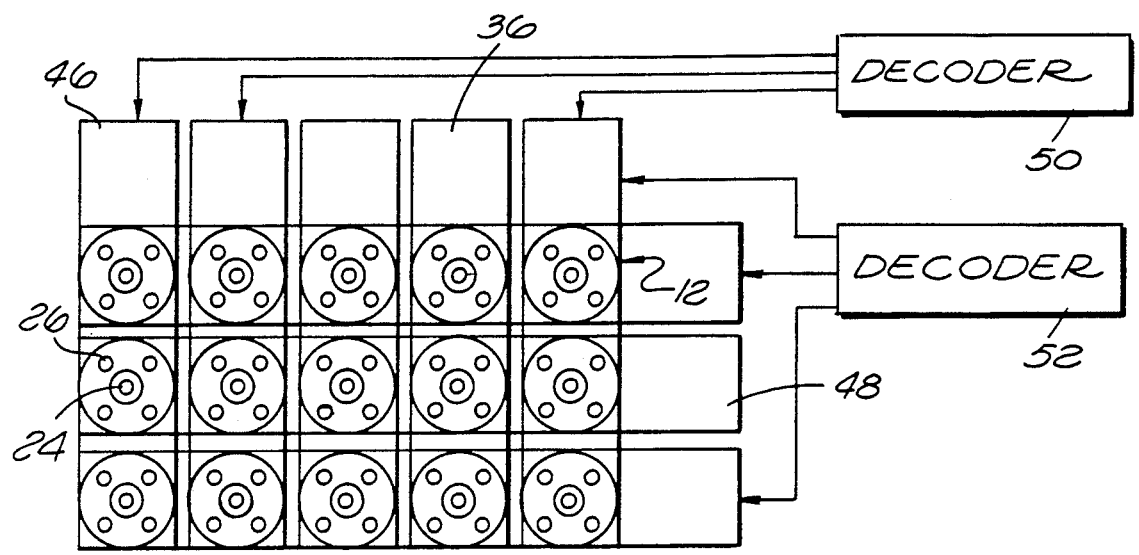
FIG. 4
FIG. 5
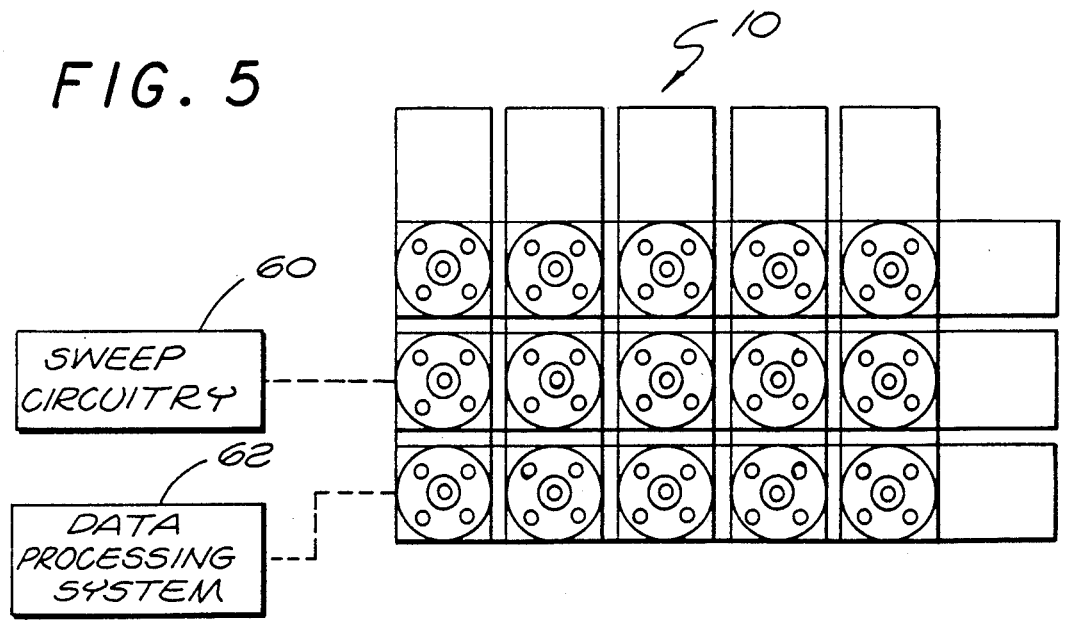

IMAGING SYSTEM

This invention relates to visual displays and more particularly relates to visual displays which provide a good resolution of an image but which are quite small. More particularly, the invention relates to visual displays which employ diodes which emit light when they break down.

As mechanisms become increasingly complex, they require increased attention from a visual standpoint. For example, the number of visual displays and meters in the cockpit of an airplane has significantly increased through the years. This is particularly true in commercial airplanes. These visual displays and meters require constant attention by the pilot or co-pilot and detract from the ability of the pilot and co-pilot to concentrate on what is around their airplane. As a result, these visual displays and meters may indirectly be the cause of accidents while airplanes are airborne.

Various attempts have been made to resolve the problems discussed in the previous paragraph. For example, a considerable effort has been made to simplify the arrangement of the displays and meters on a control panel even as the number of such displays and meters has been constantly increasing. Attempts have also been made to project visual displays to a position in the cockpit window directly in front of the pilot. In this way, the pilot is supposedly able to see this visual display at the same time that he is scanning the space in front of the airplane or to the sides of the airplane.

The attempts made thus far to solve the problems discussed in the previous paragraph have not been really successful. For example, the images projected on the cockpit window have been large and have detracted from the ability of the pilot or co-pilot to search for potentially dangerous objects in the sky. The images projected on the cockpit window have also not been as clear as might normally be desired by the pilot or co-pilot.

This invention provides apparatus for producing a clear and sharp visual display of an image directly in front of an individual such as an airplane pilot so that he can see the visual display without detracting from his ability to see objects in front of, and around, him. The visual display provided by the apparatus of this invention is quite small. In spite of its small size (e.g. 0.4" square), the apparatus provides a high density of pixels. Because of this, the apparatus of this invention is able to provide a sharp image in a small space directly in front of the pilot's eyes without interfering with the view by the pilot of the space in front of, lg and around, him.

In one embodiment of the invention, a plurality of semi-conductor diodes are disposed in an array. Each of the semi-conductor diodes may be constructed to emit light when subjected to a particular voltage. This voltage provides a reverse bias to the semi-conductor diode to break down the semi-conductor diode and to provide for the emission of light when the semi-conductor diode breaks down. The breakdown occurs at the junction between a pair of electrodes in the semi-conductor diode. One of the electrodes may be an n electrode and the other electrode may be a p electrode. To break down the diode, a positive voltage in the order of three (3) to five (5) volts may be applied to the n electrode and a ground voltage may be applied to the p electrode.

The diodes are so small that an array of $1024 \times 1024$ diodes can be disposed in a space approximately 0.4" square such that each diode can be considered as a pixel. The diodes may be scanned, as are the pixels in a raster scan, preferably on a repetitive basis. During such scan, individual ones of the diodes receive the breakdown voltage in representation of a visual image to provide a visual display of the image in the pixels defined by the diodes.

The visible light for each pixel is visible at the junction between the p electrode and the n electrode in the diode representing such pixel. The n electrode may be shaped, as in a tear drop, to facilitate the production of such light at such junction, which may be at the pointed end of the tear drop. The light may be formed by the emission of photons when electrons are momentarily trapped in an oxide layer above the junction and then fall back to ground.

Figure 3:
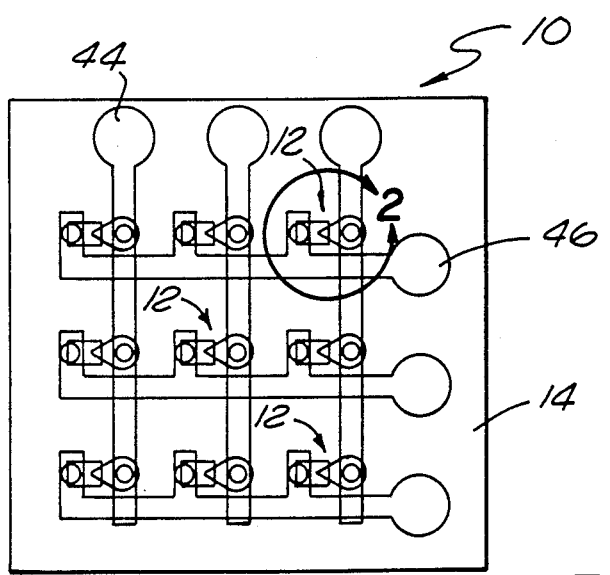
FIG. 3 is a schematic top plan view of an array of diodes correspondig to the diode shown in FIGS. 1 and 2.

FIG. 4 is a schematic diagram, partly in electrical block form, of the array shown in FIG. 3 and of electrical stages for forming a visual image by energizing individual ones of the diodes in the array; and FIG. 5 is a schematic diagram, partly in electrical block form, of a system including the array shown in FIG. 3 for scanning the array, as in a raster scan, to produce a visual display of the image in the array.

Figure 1:
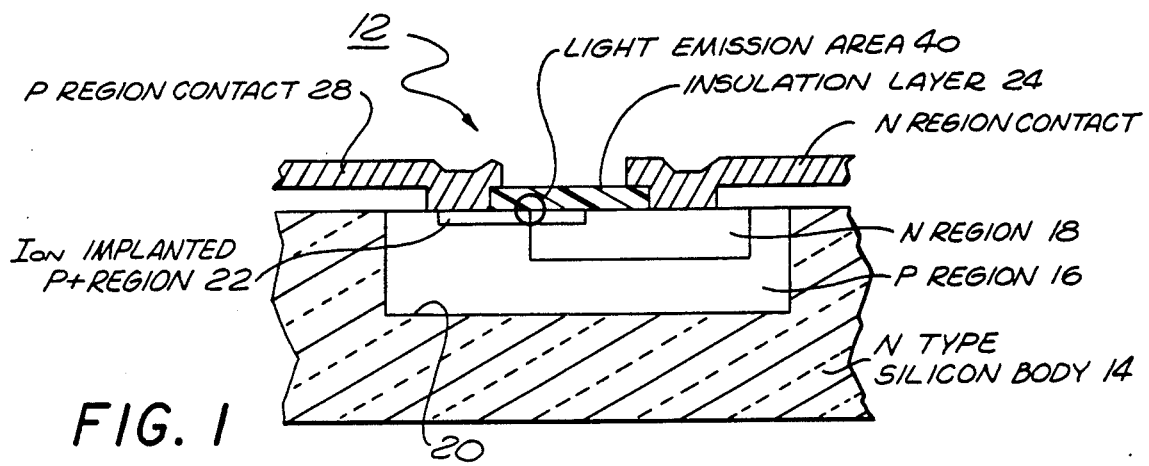
FIG. 1 is a schematic elevational view of a diode which is utilized in one embodiment of the invention.
Figure 2:
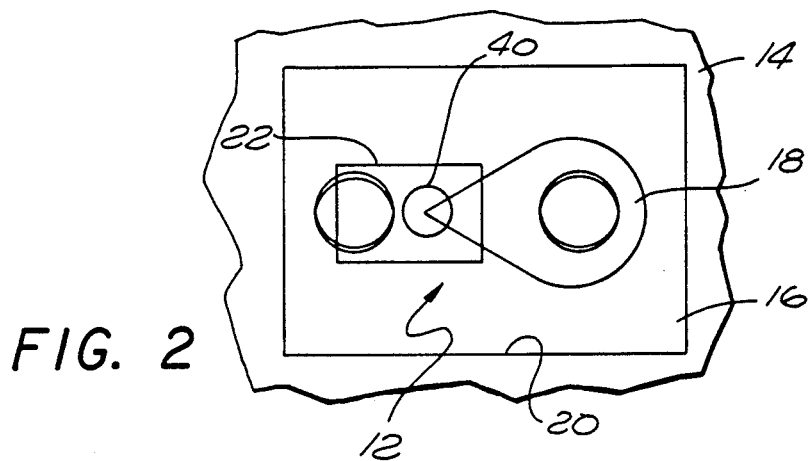
FIG. 2 is a schematic top plan view of the diode shown in FIG. 1.

In one embodiment of the invention, an array generally indicated at 10 in FIG. 3 is formed from a plurality of light diodes each generally indicated at 12 in FIG. 1. Each of the light diodes 12 may be provided on an integrated circuit chip having a body 14 (FIGS. 1 and 2) formed from a suitable material such as a silicon crystal which may be of the n type. A layer 16 (or electrode) defining a p channel electrode may be formed on the body 14 and a layer 18 (or electrode) defining an n channel electrode may be formed on the layer 16. The layer 16 is constructed to define a trough 20 and the layer 18 is disposed in the trough 20 in abutting relationship with the layer 16.

An implanted p+ layer 22 (or electrode) may be provided at the surface of the body 14 and may be disposed partially on the body 14 and partially on the layer 18. The layer 18 may have a tear drop configuration in plan, with the pointed end of the tear drop configuration abutting the p+ layer 22. The layers 16, 18 and 22 may be formed by doping the integrated circuit chip 14 in a manner well known in the art. The depth of each of the layers 16, 18 and 22 may be in the order of one (1) micron or less.

An insulating layer 24 made from a suitable oxide such as silicon dioxide is formed on the surface of the body 14. The layer 2+ may be disposed partially above the p layer 16 and partially above the n layer 18. A terminal 26 made from a metallic material is disposed in a layer partially on the upper surface of the insulating layer 22 and partially on the upper surface of the layer 18. A terminal 28 made from a metallic material is disposed partially on the upper surface of the insulating layer 24, partially on the p+ region 22 and partially on the layer 16. The terminal 26 establishes electrical contact with the layer 18 and the terminal 28 establishes electrical contact with the layer and the 22 layer 16. A negative or ground voltage may be applied to the terminal 28 and a positive voltage may be applied to the terminal 26.

The terminal 26 may be formed by initially disposign a suitable material such as titanium or tungsten on the layer 18 in a thin layer such as approximately two tenths of a micron (0.2 $\mu$) thick. Titanium or tungsten is advantageous because it is electrically conductive. A suitable material such as gold may be disposed on the titanium or tungsten in a thin layer such as approximately one micron (1 $\mu$) thick. Gold is advantageous because it adheres to the titanium or tungsten, is highly conductive electrically and is neutral chemically so that it does not oxidize when exposed to different chemicals in the atmosphere.

The terminal 28 may be formed by initially disposing a thin layer of a suitable material such as titanium or tungsten on the layers 16 and 22. The thin layer of the terminal 28 may be approximatley two tenths of a micron (0.2 $\mu$) thick. A suitable material such as gold may be disposed on the titanium or tungsten in a thin layer such as approximately one micron (1 $\mu$) thick.

When the light diode 12 is reverse biased with at least a particular voltage between the p+ channel 22 and the n channel 18, the light diode 12 breaks down and emits photons at the junctions between the p and n channels. This junction is encircled as at 40 in FIGS. 1 and 2. Such a photon emission produces a white light at the junction 40. This white light is visible to the eye of a human being because the layers 16, 18 and 22 are thin and because the junction 40 is not covered by g the metallic layers 26 and 28.

The physical principles causing the production of the white light at the junction 40 of the diode 12 are not known. However, it may result from fluorescence produced at the interface of the silicon oxide layer 24. More likely, the electrons are momentarily trapped in the oxide layer 24 and then fall back to ground. Alternatively, the white light may be produced at the junction 40 by a combination of the two (2) phenomena discussed above. At any rate, the production of the white light at the junction 40 is facilitated by providing the junction near the surface of the body 14 and by providing the layer 18 with a tear drop configuration having a pointed end. By providing the layer 18 with a pointed end, the field strength of the electrical field is highest at this end to facilitate the production of the white light there.

FIG. 3 illustrates the array 10 formed from the diodes 12. In FIG. 3, contact fingers 44 are shown as extending vertically to define the terminals 26 for the n layers 18. Contact fingers 46 are shown as extending horizontally at positions displaced from the p+ layers 22. Projections are then shown as extending from the fingers 46 to define the terminals 28. Individual ones of the diodes 12 are energized when voltages are simultaneously introduced to the terminals 26 and 28 for such diodes.

Each of the diodes 12 may have dimensions less than approximately ten microns (10 $\mu$). This means that a rectangular array of approximately ten hundred and twenty-four (1024) diodes 12 by approximately ten hundred and twenty-four (1024) diodes can be disposed in a space approximately four tenths of an inch (0.4") square to provide a graphics image of high resolution. For a normal television or computer image, the array may occupy a space approximately one quarter of an inch square ($\frac{1}{4}" \times \frac{1}{4}"$). This array is generally indicated at 10 in FIG. 3.

In the arrangement shown in FIG. 4, a decoder 50 may be provided for the y-axis to decode binary signals and select one of the fingers 44 to be energized. When the selected one of the fingers 44 is energized, the terminals 26 in the associated column receive a positive potential in the order of three volts (3 V.) to five volts (5 V.). Similarly, a decoder 52 may be provided for the x-axis to decode binary signals and select one of the fingers 46 to be energized. When the selected one of the metallic strips 46 is energized, the terminals 28 in the associated rows receive a reference potential such as ground. Only the diode common to the selected row and the selected column is energized because it is the only diode which receives a positive voltage on its layer 18 and a ground voltage on its layer 22. It will be appreciated that more than one (1) diode may be energized in this manner at any selected time to provide a message in the array 10.

FIG. 5 illustrates an arrangement for producing a raster scan, as in a television image, on a repetitive basis. In the embodiment shown in FIG. 5, sweep circuitry 60 is provided for providing a raster scan of progressive horizontal lines of an image. Each of the horizontal lines may be g separated by a particular distance in a downward direction from the previously scanned line. The sweep circuitry 60 may be operative to ground the terminals in successive ones of the diodes 12 in the raster scan. The sweep circuitry 60 may be disposed on the integrated circuit chip with the diodes 12.

A computer or data processing system 62 may be provided to produce voltages for introduction to the successive diodes in the raster scan in representation of an image to be displayed on the screen represented by the diode array 10. For example, when a diode 12 is to be illuminated, a positive voltage may be applied by the data processing system 62 to the terminal 26 for that diode. The positive voltage is not applied to the terminal 26 for that diode when the diode is not to be illuminated. The sweep circuitry 60 and the computer or data processing system 62 may be constructed in a conventional manner. The sweep circuitry 60 and the computer or data processing system 62 may be disposed on the body 14 with the diodes 12.

The apparatus constituting this invention has certain important advantages. It provides a diode which is capable of emitting light by reverse biasing the diode. The diode is able to emit such light by disposing electrodes near the surface of a silicon chip and by forming the metal terminals for the electrodes (or layers) so that the terminals do not interfere with the light transmission. Each of the diodes may be quite small. Because of this, the diodes can be disposed in an array which contains a large number of such diodes in a small space.

The apparatus disclosed above has other important advantages in addition to those discussed above. It disposes an array of a large number of the diodes 12 in a relatively small area and provides an image with a high resolution in this small space. Because of this, the array 10 of the diodes 12 can be disposed on the eyeglasses of a pilot to provide information or instructions to the pilot without impairing the ability of the pilot to see any objects around, or in front of, an airplane under his control. The apparatus of this invention is able to provide such information or instructions in a reliable and relatively simple manner such as by using circuitry such as sweep circuits, data processing systems and/or decoders well known in the art and by disposing all of such circuitry on an integrated circuit chip with the diodes.

The systems disposed on the body 14 and incorporating the diodes 12 have certain other advantages in addition to those discussed above. Since the diodes 12 emit white light, the detectors associated with the diodes do not have to be matched to the emission from the diodes as in light emitting diodes of the prior art, such as gallium arsenide diodes which emit monochromatic light. Since the light emitting diodes 12 emit white light, a full color diplay can be provided by using color filters.

The light emitting diodes 12 are also advantageous in that they can be disposed on an integrated circuit chip such as the body 14 with the associated circuitry in a relatively easy manner since the diodes and the chips are formed from silicon. This allows the chip, and the visual display on the chip, to be reduced to a small size so that the display on the chip can be disposed in front of the viewer's eye without interfering with the viewer's scanning of other objects in front of, and around, the viewer.

Although this invention has been disclosed and illustrated with reference to particular embodiments, the principles involved are susceptible for use in numerous other embodiments which will be apparent to persons skilled in the art. The invention is, therefore, to be limited only as indicated by the scope of the appended claims.

We claim:

1. In combination for providing a display of a visual image,
   a plurality of diodes disposed in contiguous relationships to define an array, each of the diodes constituting a semi-conductor having n and p layers disposed relative to each other to define a junction, each of the semi-conductors being constructed to emit light at the jnction between the n and p layers when a particular voltage is applied between the n and p layers in the semi-conductor to reverse bias the diode, and
   means for applying the particular voltage between the n and p layers in individual ones of the diodes in the array to reverse bias the individual diodes in accordance with the visual image to be displayed on the array.

2. In a combination as set forth in claim 1,
   the n layer having substantially a tear drop configuration with a pointed end, the pointed end being disposed at the junction of the n layer with the p layer.

3. In a combination as set forth in claim 1,
   terminals for the n layer and the p layer being disposed in each diode at positions displaced from the junction between the p layer and the n layer to provide for the illumination of light at such junction.

4. In a combination as set forth in claim 1,
   means for providing a raster scan of the diodes in the array, and
   means for applying voltages between the n and p layers of individual ones of the diodes in the array during such scan to obtain the production of the white light from such individual diodes at the junctions between the p and n layers in such diodes.

5. In a combination as set forth in claim 1,
   the array of diodes being defined by rows and columns,
   means for applying a voltage to the n layers in the diodes in a particular column in the array, and
   means for applying a voltage to the p layers in the diodes in a particular row in the array to obtain the particular voltage between the n and p layers in the diode common to the particular row and the particular column and to obtain the emission of light from the diode common to the particular row and the particular column at the junction between the p and n layers in such diode.

6. In a combination as set forth in claim 1, the semiconductor being made from silicon.

7. In combination for providing a display of a visual image,
   a plurality of diodes disposed in contiguous relationship to define an array, each of the diodes constituting a semi-conductor having n and p layers disposed relative to each other to define a junction, each of the semi-conductors being constructed to emit light at the junction between the n and p layers when a particular voltage is applied between the n and p layers in the semi-conductor, and
   means for applying the particular voltage between the n and p layers in individual ones of the diodes in the array in accordance with the visual image to be displayed on the array,
   each of the diodes being constructed to provide an n type body, a p layer on the body, an n layer on the p layer and a p+ layer partially on the body and partially on the n layer and the junction being between the p+ layer and the n layer.

8. In a combination as set forth in claim 7,
   the n layer having substantially a tear drop configuration with a pointed end and the pointed end being disposed at the junction of the n layer with the p+ layer.

9. In a combination as recited in claim 7,
   terminals for the n layer and p+ layer being disposed in each diode at positions displaced from the junction between the p+ layer and the n layer to provide for the illumination of light at such junction, and
   an electrically insulating layer disposed on the body in partially overlapping relationship with the n layer and in partially overlapping relationship with the p+ layer.

10. In a combination as set forth in claim 9,
    means for providing a raster scan of the diodes in the array, and
    means for applying the particular voltage between the n and p+ layers of individual ones of the diodes in the array during such scan to obtain the production of the white light from such individual diodes at the junction between the p' and n layers in such diodes.

11. In combination for providing a display of a visual image,
    an array of semi-conductors each having an n layer and a p layer and a junction between the n and p layers and each constructed to emit white light at such junction when subjected to a particular voltage between the n layer and the p layer to reverse bias such semi-conductor,
    means for providing a scan of the semi-conductors in the array to provide for the activation of successive semi-conductors in the array, and
    means for providing for the introduction of the particular voltage between the n and p layers in individual ones of the semi-conductors in the array to obtain the emission of white light from such individual ones of such semi-conductors at the junction between the n and p layers in such individual semi-conductors during such scan in accordance with the visual image to be displayed.

12. In a combination as set forth in claim 11, each of the semi-conductors in the array being constructed to emit light when subjected to the particular voltage to reverse bias the semi-conductor and each of the semi-conductors being formed from silicon.

13. In a combination as set forth in claim 11, the array of semi-conductors being formed on a semi-conductor chip made from silicon.

14. In a combination as set forth in claim 11, an integrated circuit chip, the semi-conductors in the array being disposed on the integrated circuit chip in an adjacent relationship defining sucessive rows and columns and the scanning means providing for a raster scan of the semi-conductors in the successive rows.

15. In a combination as set forth in claim 14, each of the semi-conductors providing for the introduction of a positive voltage to the n layer in such semi-conductor and a negative voltage to the p layer in such semi-conductor to obtain the particular voltage and providing for the emission of the white light at the junction of the n layer and the p layer in the semi-conductor when the particular voltage is applied between the n layer and the p layer and the n layer being shaped at the junction with the p layer to provide a field strength for facilitating the production of the white light at such junction.

16. In combination for providing a display of a visual image,
an array of semi-conductor diodes, each diode being constructed to break down when subjected to a particular reverse bias voltage cross the diode and to become illuminated upon breakdown, the diodes in the array being disposed in a particular relationship to define rows and columns,
means for introducing a first voltage to the diodes in an individual column in the array in accordance with the visual image, and
means for introducing a second voltage to the diodes in an individual row in the array to obtain the production of the particular reverse bias voltage across the diode common to the individual column and the individual row for breaking down the diode.

17. In a combination as set forth in claim 16, the array of semi-conductors being formed on a semi-conductor chip made from silicon.

18. In a combination as set forth in claim 16, each of the diodes having first and second layers constructed to have voltages applied to them in the particular reverse bias relationship and each of the diodes being constructed to break down when the layers are subjected to voltages having a voltage difference at least equal to the particular reverse bias voltage and the first and second layers in each diode being constructed to define a junction and the junction in each diode being illuminated when the diode breaks down.

19. In a combination as set forth in claim 18, the first and second layers in each diode respectively constituting n and p layers and a terminal being coupled to the n layer in each diode and a terminal being coupled to the p layer in each diode and the illumination in each diode being provided at the junction between the n layer and the p layer and the first voltage being applied to the terminals coupled to the n layer in the diodes in an individual one of the columns and the second voltage being applied to the terminal coupled to the p layer in the diodes in an individual one of the rows.

20. In a combination as set forth in claim 19, the n layer in each diode being provided with a configuration to facilitate the production of the white light at the junction between the n and p layers in the diode.

21. In a combination as set forth in claim 19, the junction between the first and second layers in each diode being displaced from the terminals for such diode to provide for an illumination of such junction when the diode breaks down.

22. In a combination as set forth in claim 21, each diode being formed form a body constituting an n type, the p layer being disposed on the body and the n layer being disposed on the p layer and a p+ layer being disposed partially on the n layer and partially on the p layer and the junction being provided between the n layer and the p+ layer.

23. In a combination as set forth in claim 22, an electrically insulating layer disposed in each diode partially on the n layer and partially on the p+ layer in such diode, and
the n layer in each diode being provided with a configuration to facilitate the production of the white light at the junction between the p and n layers in such diode.

24. In combination for emitting light, an integrated circuit chip made from a semi-conductive material constituting an n type,
a p layer formed on the integrated circuit chip,
an n layer formed on the integrated circuit chip in a particular relationship to the p layer to define a junction with the p layer,
a p+ layer disposed partially on the p layer and partially on the n layer to define a junction with the n layer for the emission of visible light from the junction between the p layer and the n layer upon the production of a particular voltage between the p layer and the n layer,
first terminal means formed on the integrated circuit chip substantially at the position of the p layer to contact the p+ layer and the p layer and made from an electrically conductive material, and
second terminal means formed on the integrated circuit chip at the position of the n layer and made from an electrically conductive material, and
means for introducing voltages to the first and second terminal means to obtain the emission of the visible light at the junction between the p and n layers.

25. In a combination as set forth in claim 24, the semi-conductor material in the integrated circuit chip constituting silicon.

26. In a combination as set forth in claim 24, the voltage introducing means reverse biasing the p layer and the n layer with the particular voltage to obtain the emission of the visible light at the junction between the p and n layers in accordance with such reverse biasing.

27. In a combination as set forth in claim 26,
means for applying a positive voltage of a particular magnitude to the second terminal means relative to the voltage applied to the first terminal means to reverse bias the n and p layers with the particular voltage and to obtain the emission of visible light in accordance with such reverse biasing.

28. In a combination as set forth in claim 24,
means for applying a positive voltage of a particular magnitude to the second terminal means relative to the voltage applied to the first terminal means to obtain the emission of visible light from the junction between the n layer and the p layer.

29. In a combination as set forth in claim 28,
a layer of an electrically insulating material disposed partially on the n layer and partially on the p+ layer and covering the junction between the n layer and the p+ layer.

30. In a combination as recited in claim 29,
the integrated circuit chip being made from silicon and
the insulating material being made from silicon dioxide.

31. In a combination as set forth in claim 30,
each of the terminal means being formed from a first layer of an electrically conductive material and a second layer of an electrically conductive, chemically inert material with properties of adhering to the first layer of the electrically conductive material.

32. In a combination as set forth in claim 31,
the first layer of each terminal means being titanium or tungsten, and
the second layer of each terminal means being gold.

* * * * *